United States Patent
Cudak et al.

(10) Patent No.: US 10,910,025 B2
(45) Date of Patent: Feb. 2, 2021

(54) FLEXIBLE UTILIZATION OF BLOCK STORAGE IN A COMPUTING SYSTEM

(71) Applicant: International Business Machines Corporation, Armonk, NY (US)

(72) Inventors: Gary D. Cudak, Creedmoor, NC (US); Christopher J. Hardee, Raleigh, NC (US); Adam Roberts, Moncure, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 2181 days.

(21) Appl. No.: 13/721,114

(22) Filed: Dec. 20, 2012

(65) Prior Publication Data
US 2014/0181385 A1 Jun. 26, 2014

(51) Int. Cl.
G06F 12/00 (2006.01)
G11C 7/10 (2006.01)
(Continued)

(52) U.S. Cl.
CPC ............ *G11C 7/1072* (2013.01); *G06F 12/06* (2013.01); *G06F 12/0871* (2013.01); *G06F 2212/205* (2013.01); *G06F 2212/6012* (2013.01)

(58) Field of Classification Search
CPC ......... G06F 12/0246; G06F 2212/7201; G06F 3/0634; G06F 2212/214; G06F 3/0685;
(Continued)

(56) References Cited

U.S. PATENT DOCUMENTS

| | | | | |
|---|---|---|---|---|
| 5,303,363 A | * | 4/1994 | Berarducci | 711/206 |
| 5,860,083 A | * | 1/1999 | Sukegawa | 711/103 |

(Continued)

FOREIGN PATENT DOCUMENTS

| | | |
|---|---|---|
| CN | 101483050 A | 7/2009 |
| CN | 201444642 U | 4/2010 |

(Continued)

OTHER PUBLICATIONS

Alexandre Bicas Caldeira et al., "IBM Power 710 and 730 Technical Overview and Introduction," An IBM Redpaper publication, 170 pages, published Nov. 18, 2011, last updated Mar. 22, 2012, IBM Redbooks, © Copyright International Business Machines Corporation 2011 <http://www.redbooks.ibm.com/redpapers/pdfs/redp4796.pdf>.

(Continued)

*Primary Examiner* — Prasith Thammavong
(74) *Attorney, Agent, or Firm* — Jeffrey L. Streets

(57) ABSTRACT

Embodiments of the present invention disclose a method, computer program product, and system for utilizing a block storage device as Dynamic Random-Access Memory (DRAM) space, wherein a computer includes at least one DRAM module and at least one block storage device interfaced to the computer using a double data rate (DDR) interface. During boot up, the computer configures DRAM and block storage devices of the computer for utilization as DRAM or block storage. Then the computer determines that more DRAM space is required. Responsive to determining that more DRAM space is required, the computer transforms a block storage device into DRAM space. Once the computer determines that the transformed block storage device that is being used for DRAM space is no longer needed to be used as DRAM space, the computer transforms the block storage device back to block storage space.

17 Claims, 3 Drawing Sheets

(51) Int. Cl.
*G06F 12/06* (2006.01)
*G06F 12/0871* (2016.01)

(58) Field of Classification Search
CPC .......... G06F 21/79; G06F 11/10; G06F 3/061; G06F 3/064; G06F 12/023; G06F 3/0665; G11C 7/1072
See application file for complete search history.

(56) References Cited

U.S. PATENT DOCUMENTS

| | | | |
|---|---|---|---|
| 6,879,266 B1* | 4/2005 | Dye et al. | 341/51 |
| 2003/0090937 A1* | 5/2003 | Chen | G11C 11/4078 365/185.08 |
| 2005/0144402 A1* | 6/2005 | Beverly | G06F 12/1475 711/152 |
| 2005/0228980 A1* | 10/2005 | Brokish | G06F 21/74 713/2 |
| 2005/0246501 A1* | 11/2005 | Batra | G06F 12/0888 711/138 |
| 2007/0033433 A1* | 2/2007 | Pecone et al. | 714/6 |
| 2007/0136523 A1* | 6/2007 | Bonella et al. | 711/113 |
| 2007/0294496 A1* | 12/2007 | Goss et al. | 711/163 |
| 2009/0055580 A1* | 2/2009 | Moscibroda | G06F 13/1642 711/104 |
| 2009/0157950 A1* | 6/2009 | Selinger | G06F 12/0246 711/103 |
| 2009/0158918 A1* | 6/2009 | Norman | G11C 5/02 84/603 |
| 2009/0248958 A1* | 10/2009 | Tzeng | G06F 12/08 711/103 |
| 2009/0248959 A1* | 10/2009 | Tzeng | G06F 12/08 711/103 |
| 2010/0017556 A1* | 1/2010 | Chin | G06F 12/0866 711/103 |
| 2010/0293420 A1* | 11/2010 | Kapil | G06F 12/08 714/710 |
| 2011/0131366 A1* | 6/2011 | Nakai et al. | 711/103 |
| 2011/0153903 A1* | 6/2011 | Hinkle et al. | 710/313 |
| 2012/0017036 A1* | 1/2012 | Cho | 711/103 |
| 2012/0089796 A1* | 4/2012 | Fukazawa et al. | 711/162 |
| 2012/0159045 A1* | 6/2012 | Hinkle et al. | 711/103 |
| 2012/0311237 A1* | 12/2012 | Park | G06F 12/0246 711/103 |
| 2013/0086309 A1* | 4/2013 | Lee | G06F 12/0246 711/103 |
| 2013/0086311 A1* | 4/2013 | Huang | G06F 3/0659 711/103 |
| 2013/0091321 A1* | 4/2013 | Nishtala | G06F 12/08 711/103 |

FOREIGN PATENT DOCUMENTS

CN 201514769 U 6/2010
JP 2008122565 A * 5/2008

OTHER PUBLICATIONS

Allon Cohen, "Doubling Flash Utilization by Combining Volume Acceleration with Cross WAN Remote Replication," Aug. 23, 2011, pp. 1-2, Sanrad blog, <http://sanrad.com/wordpress/2011/08/23/doubling-flash-utilization-by-combining-volume-acceleration-with-cross-wan-remote-replication/>.

* cited by examiner

FLEXIBLE UTILIZATION OF BLOCK STORAGE IN A COMPUTING SYSTEM

FIELD OF THE INVENTION

The present invention relates generally to the field of storage utilization in a computing system, and more particularly to utilizing a block storage device as Dynamic Random-Access Memory (DRAM) space.

BACKGROUND OF THE INVENTION

Dynamic Random-Access Memory (DRAM) is a form of volatile memory (memory that requires power to maintain stored information) that is utilized throughout a wide variety of computing systems such as personal computers and workstations. DRAM is composed of electrically charged capacitors which store data and allow computers to quickly access any portion of the stored data. Since DRAM stores bits of data in individual storage cells (composed of a capacitor and a transistor), the capacitor of the storage cell needs to be refreshed periodically, which differentiates DRAM from Static Random-Access Memory (SRAM).

A block storage device is a form of data storage used in computing that stores blocks of data. A block has a specified length in bits (the block size). An example of block storage used in computing systems is flash memory, which is non-volatile (i.e. can maintain stored information when not powered).

DRAM and block storage devices can be utilized by a computing system through an interface utilizing double data rate type 3 (DDR3). A dual in-line memory module (DIMM) can be used to interface DRAM and block storage devices with a printed circuit board.

SUMMARY

Embodiments of the present invention disclose a method, computer program product, and system for utilizing a block storage device as Dynamic Random-Access Memory (DRAM) space, wherein a computer includes at least one DRAM module and at least one block storage device interfaced to the computer using a double data rate (DDR) interface. During boot up, the computer configures DRAM and block storage devices of the computer for utilization as DRAM or block storage. Then the computer determines that more DRAM space is required. Responsive to determining that more DRAM space is required, the computer transforms a block storage device into DRAM space. Once the computer determines that the transformed block storage device that is being used for DRAM space is no longer needed to be used as DRAM space, the computer transforms the block storage device back to block storage space.

DETAILED DESCRIPTION

Figure 1:
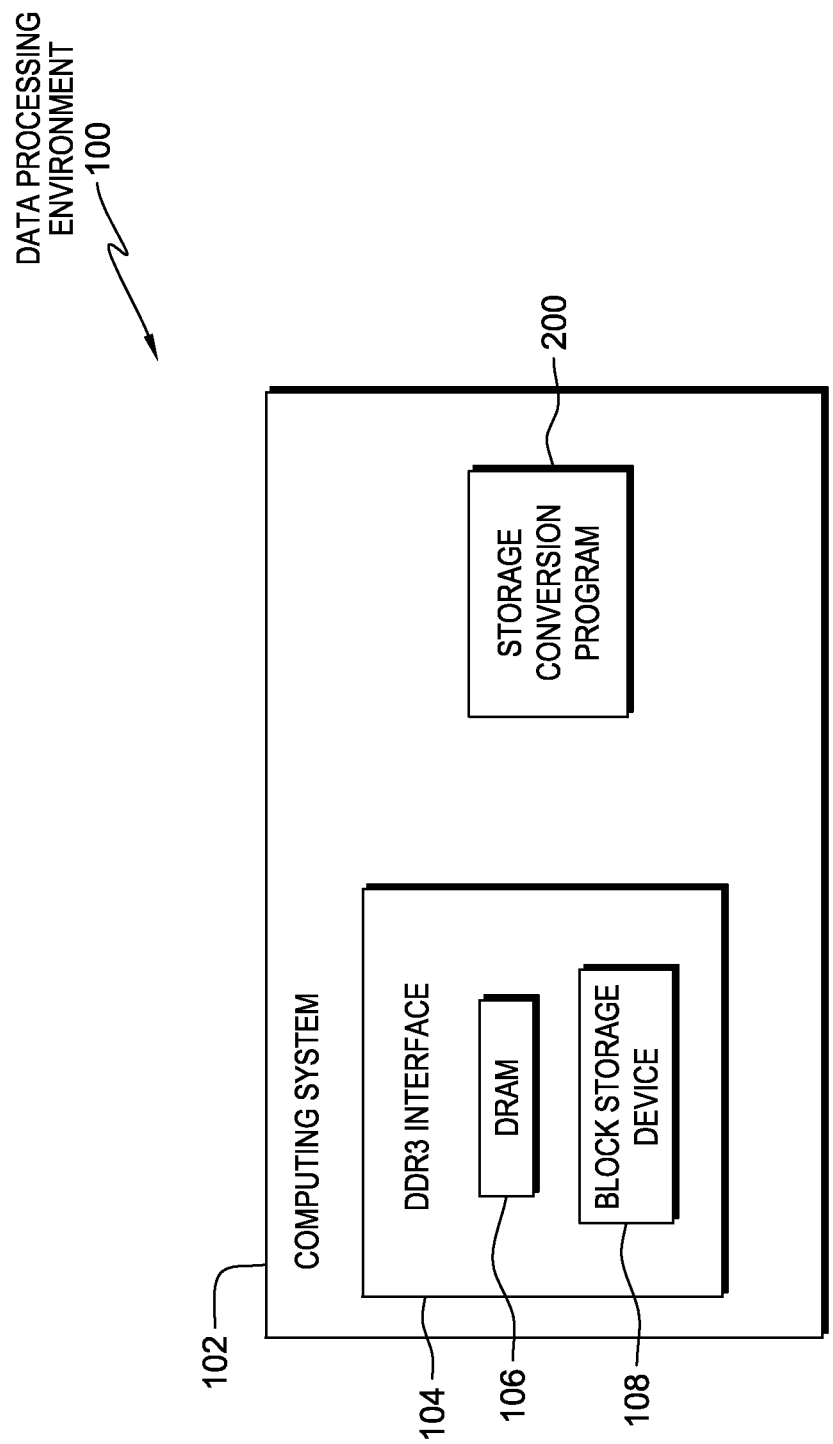
FIG. 1 is a functional block diagram of a data processing environment in accordance with an embodiment of the present invention.

Embodiments of the present invention recognize that computing systems can only have a finite amount of space that can be utilized by DRAM and block storage devices. This causes a user of a computing system to make a decision on the quantity of each type of resource that can be included in the system. In a situation where a user needs to use a Peripheral Component Interconnect (PCI) slot on a component that is not DRAM or block storage (i.e. an Ethernet card), the user may then choose to fulfill their block storage needs with DDR3 based block storage. This would reduce the number of DDR3 DIMM slots that can be used for DRAM.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

The present invention will now be described in detail with reference to the FIGS. FIG. 1 is a functional block diagram illustrating a data processing environment 100, in accordance with one embodiment of the present invention.

Data processing environment 100 includes computing system 102. In various embodiments of the present invention, computing system 102 may be a workstation, personal computer, personal digital assistant, mobile phone, or any other device capable of executing program instructions. In general, computing system 102 is representative of any electronic device or combination of electronic devices capable of executing machine-readable program instructions, as described in greater detail with regard to FIG. 3. In another embodiment, computing system 102 can be a desktop computer, specialized computer server, or any other computer system known in the art.

In one embodiment, data processing environment 100 includes storage conversion program 200 and a DDR3 interface 104 that includes DRAM 106 and block storage device 108. DDR3 interface 104 allows computing system 102 to utilize DRAM 106 and block storage device 108. DDR3 is a form of data transfer interface that utilizes double data rate (DDR) to transfer data in a computing system. In an alternate embodiment, DDR3 interface 104 may utilize other forms of double data rate (DDR) data transfer that are capable of interfacing with DRAM 106 and block storage device 108 (i.e. DDR, DDR2, DDR4). DDR3 interface 104 includes a hardware abstraction layer between the interface of DRAM 106 and block storage device 108. In exemplary embodiments, the hardware abstraction layer is implemented in the form of software that exists between physical hardware of computing system 102 (i.e. DRAM 106 and block storage device 108) and software that runs on computing system 102. A function of the hardware abstraction layer is to hide differences in hardware from an operating system of computing system 102, which allows an operating system to interact with hardware devices (i.e. DRAM 106 and block storage device 108) at a general or abstract level as opposed to a detailed hardware level.

DRAM 106 is a form of volatile memory (memory that requires power to maintain stored information) that is utilized throughout a wide variety of computing systems such as personal computers, workstations and server computers. In general, DRAM 106 can be any suitable volatile computer readable storage media. In one embodiment, DRAM 106 utilizes a DIMM to interface with a DDR3 interface 104 located on a circuit board of computing system 102. Computing system 102 utilizes DRAM 106 to store running programs and data for programs so that computing system 102 can access the information quickly. In one embodiment, block storage device 108 is a form of data storage that computing system 102 utilizes to store blocks of data. In an example, block storage device 108 can exist in the form of flash memory utilizing a DIMM to interface with DDR3 interface 104. Utilization of DRAM 106 and block storage device 108 is discussed in greater detail with regard to FIG. 3. In alternate embodiments, computing system 102 can include more than one iteration of DRAM 106 and block storage device 108. The amount of DRAM 106 and block storage device 106 that can be interfaced with DDR3 interface 104 is limited by the number of DIMM memory slots that are included in the DDR3 interface 104 of computing system 102. In one embodiment, storage conversion program 200 communicates with DDR3 interface 104, DRAM 106, and block storage device 108 in accordance with the needs of computing system 102. The communication between storage conversion program 200 with DDR3 interface 104 is discussed in greater detail with regard to FIG. 2.

Figure 2:
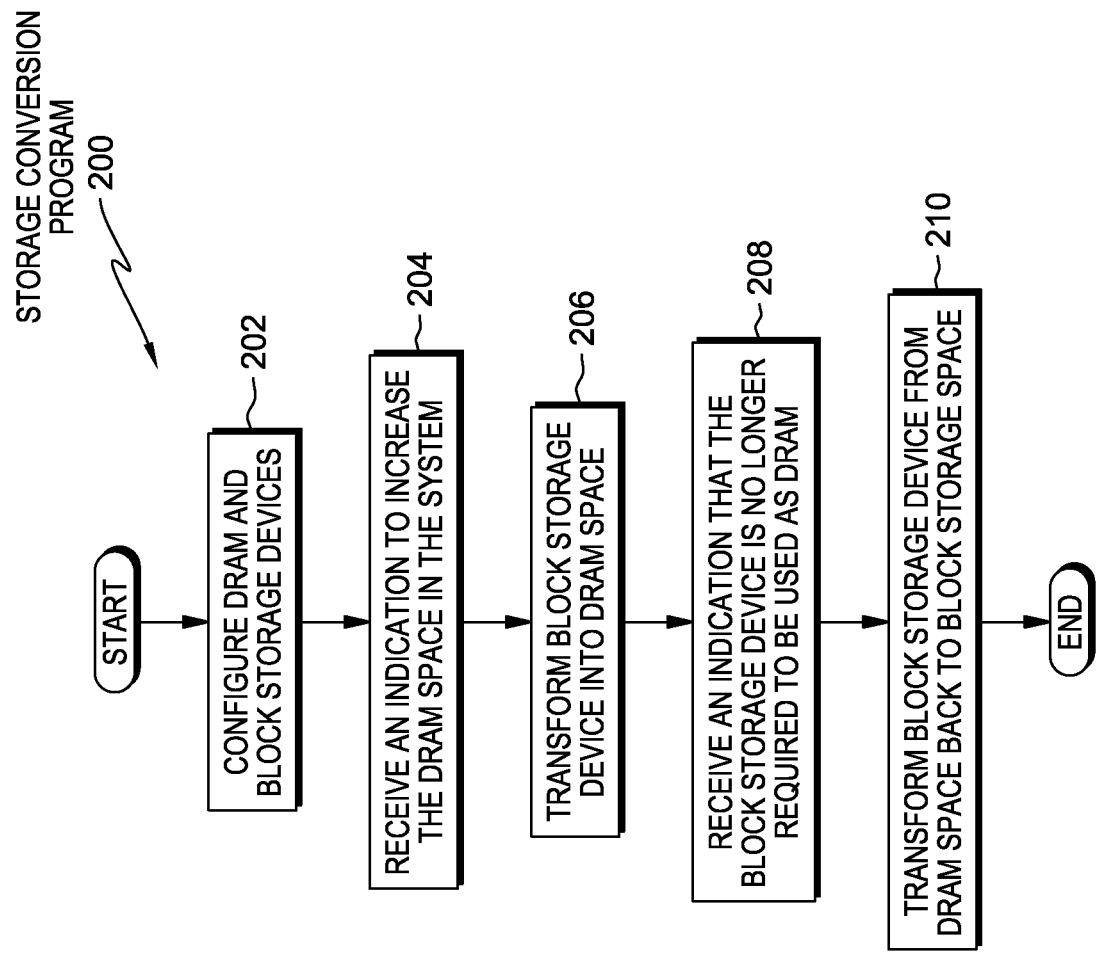
FIG. 2 is a flowchart depicting operational steps of a program for allowing a block storage device to be utilized as Dynamic Random-Access Memory (DRAM) space, in accordance with an embodiment of the present invention.

FIG. 2 is a flowchart depicting operational steps of storage conversion program 200 in accordance with an exemplary embodiment of the present invention. In one embodiment, storage conversion program 200 initiates at the boot up phase of computing system 102, and works to utilize DRAM 106 and block storage device 108 in accordance with the needs of computing system 102.

In step 202, storage conversion program 200 configures DRAM 106 and block storage device 108. In one embodiment, storage conversion program 200 utilizes the hardware abstraction layer of DDR3 interface 104 during the boot up of computing system 102 to make Basic Input/Output System (BIOS) changes that control how computing system 102 maps address spaces of DRAM 106 and block storage device 108. The hardware abstraction layer within DDR3 interface 104 allows storage conversion program 200 to utilize DRAM 106 and block storage device 108 for the DRAM or block storage needs of computing system 102. In an example, the BIOS changes can prevent computing system 102 from initially mapping the address space of a block storage device 108 on DDR3 interface 104 as DRAM space, so that the block storage device will only be utilized like DRAM 106 if the computing system requires more DRAM space. Instead, the BIOS change isolates the block storage device 108 from other devices on DDR3 interface 104, and while computing system 102 is booting up, block storage device 108 is mapped to be utilized for the block storage needs of computing system 102. In one embodiment, at the point of Power-on self test (POST), storage conversion program 200 can map block storage device 108 into the DRAM memory area as "in use" for memory applications. This allows block storage device 108 to be utilized for block storage, without being utilized for DRAM space, unless needed. In an example, storage conversion program 200 ensures that computing system 102 does not use block storage device 108 as DRAM space unless computing system 102 requires more DRAM space, which is discussed in further detail in the subsequent steps of storage conversion program 200.

In step 204, storage conversion program 200 receives an indication to increase DRAM space in computer system 102. In one embodiment, step 204 is initiated when computing system 102 determines that a task requires more DRAM space than computing system 102 has available. In one example, computing system 102 attempts to bring in a large set of files and determines that the file transfer requires more DRAM 106 space than computing system 102 has available. In such an example, storage conversion program 200 is aware of the need for more DRAM 106 space, and instructs computing system 102 accordingly (discussed in step 206).

In step 206, storage conversion program 200 transforms block storage device 108 into DRAM 106 space. In one embodiment, since storage conversion program 200 determines that computing system 102 requires more DRAM 106 space, storage conversion program 200 transforms block storage device 108 into space that can be utilized substantially similar to DRAM 106. In an exemplary embodiment, the transformation process begins with a brief pausing of the inputs and outputs (I/O's) of block storage device 108, preventing any further caching of I/O's to block storage device 108 (the device being transformed). At POST, block storage device 108 was mapped as "in use" for memory applications (described with regard to step 202). In exemplary embodiments, this mapping is modified in a manner that block storage device 108 can be used as DRAM 106 space. In an example, the mapping modification for block storage device 108 can include mapping block storage device 108 as existing data mapped space for database applications, or the free space in block storage device 108 can be mapped as open so that computing system 102 can utilize the space as needed. In another example, block storage device 108 can be emptied, and utilized for memory based applications. In an example where block storage device 108 is being utilized as a cache, block storage device 108 can still be utilized for DRAM space through a reduction of the cache size (which would not break a minimum disk image size for a cache of a dynamic size). The hardware abstraction layer of DDR3 interface 104 allows computing system 102 to utilize block storage device 108 as DRAM 106 through this mapping of block storage device 108. In one embodiment, computing system 102 can now utilize block storage device 108 as DRAM 106 space as long as required.

In step 208, storage conversion program 200 receives an indication that block storage device 108 is no longer required to be used as DRAM 106. In the example of computing system 102 attempting to bring in a large set of files, storage conversion program 200 receives the indication once the file transfer has completed or enough of the file transfer has completed that computing system 102 can finish transferring the remaining files using DRAM 106.

In step 210, storage conversion program 200 transforms block storage device 108 from DRAM 106 space back to block storage space. In one embodiment, storage conversion program 200 returns block storage device 108 back to the POST configuration described in step 202, and resumes I/O's and caching processes.

In an alternate embodiment, if computing system 102 determines that more block storage is required for a process, storage conversion program 200 can allow DRAM 106 to be utilized for block storage. The hardware abstraction layer of DDR3 interface 104 allows computing system 102 to communicate with DRAM 106 and utilize DRAM 106 to store data in block storage. Once computing system 102 determines that DRAM 106 contains sufficient memory space, storage conversion program 200 returns DRAM 106 back to the POST configuration described in step 202.

Figure 3:
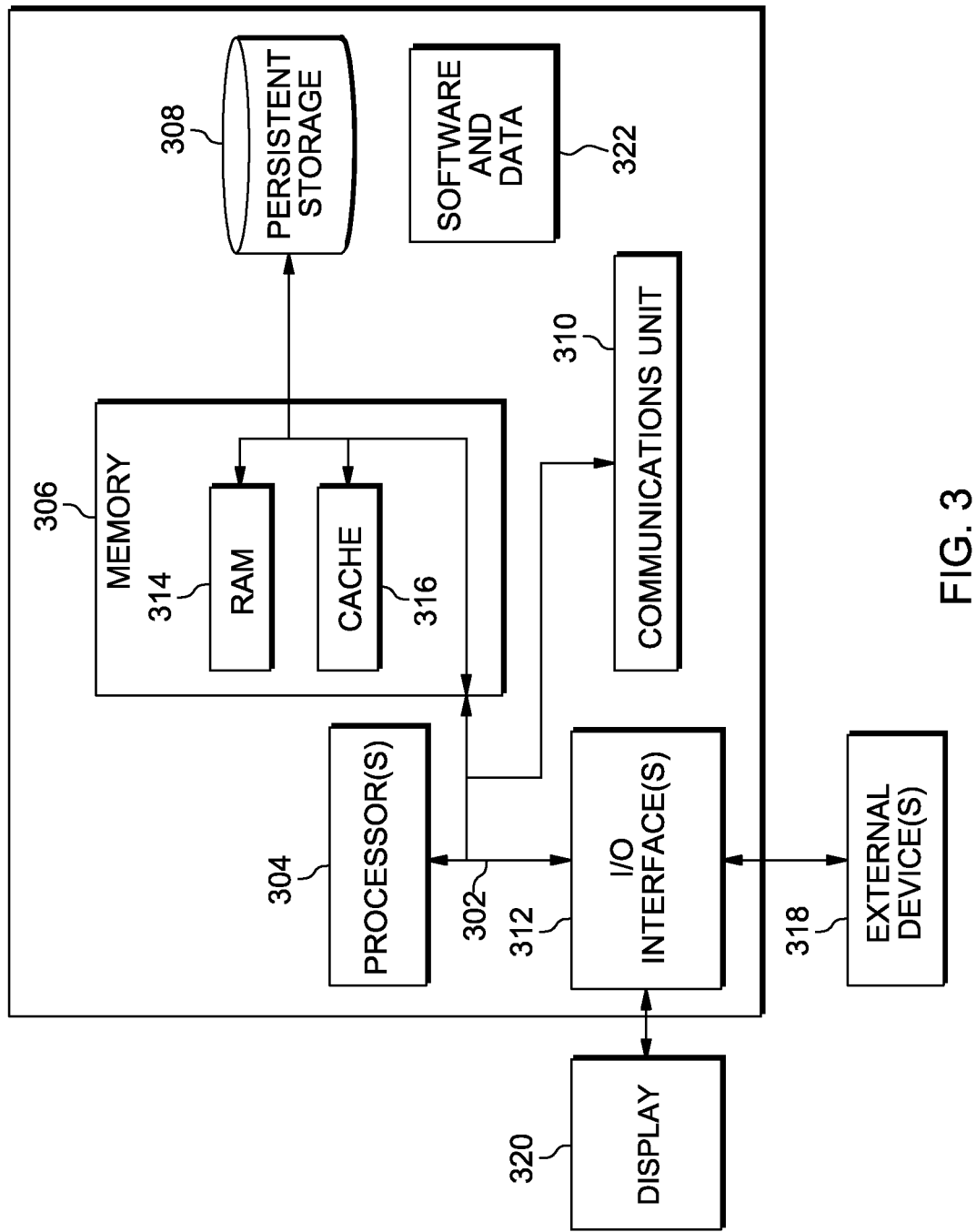
FIG. 3 depicts a block diagram of components of the computers of FIG. 1, in accordance with an embodiment of the present invention.

FIG. 3 depicts a block diagram of components of computer 300, which is representative of computing system 102, in accordance with an illustrative embodiment of the present invention. It should be appreciated that FIG. 3 provides only an illustration of one implementation and does not imply any limitations with regard to the environments in which different embodiments may be implemented. Many modifications to the depicted environment may be made.

Computer 300 includes communications fabric 302, which provides communications between computer processor(s) 304, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306 and persistent storage 308 are computer-readable storage media. In this embodiment, memory 306 includes random access memory (RAM) 314 and cache memory 316. In general, memory 306 can include any suitable volatile or non-volatile computer-readable storage media. Software and data 322 can be stored in persistent storage 308 for access and/or execution by processor(s) 304 via one or more memories of memory 306. With respect to computing system 102, software and data 322 includes storage conversion program 200.

In this embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer-readable storage medium that is also part of persistent storage 308.

Communications unit 310, in these examples, provides for communications with other data processing systems or devices. In these examples, communications unit 310 includes one or more network interface cards. Communications unit 310 may provide communications through the use of either or both physical and wireless communications links. Software and data 322 may be downloaded to persistent storage 308 through communications unit 310.

I/O interface(s) 312 allows for input and output of data with other devices that may be connected to computer 300. For example, I/O interface 312 may provide a connection to external devices 318 such as a keyboard, keypad, a touch screen, and/or some other suitable input device. External devices 318 can also include portable computer-readable storage media such as, for example, thumb drives, portable optical or magnetic disks, and memory cards. Software and data 322 can be stored on such portable computer-readable storage media and can be loaded onto persistent storage 308 via I/O interface(s) 312. I/O interface(s) 312 also connect to a display 320.

Display 320 provides a mechanism to display data to a user and may be, for example, a computer monitor. Display 320 can also function as a touch screen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for utilizing a block storage device as Dynamic Random-Access Memory (DRAM) space, the method comprising:
   a computer configuring at least one DRAM module and at least one block storage device for utilization as DRAM space or block storage;
   the computer determining that more DRAM space is required;
   responsive to determining that more DRAM space is required, the computer transforming the at least one block storage device to DRAM space, wherein the computer transforming at least one block storage device to DRAM space comprises the computer pausing inputs and outputs (I/O's) and caching processes corresponding to the at least one block storage device and the computer mapping the at least one block storage device so that the at least one block storage device can be used as DRAM space;
   the computer determining that the at least one block storage device is no longer required to be used as DRAM space; and
   responsive to determining that the at least one block storage device is no longer required to be used as DRAM space, the computer transforming the at least one block storage device back to block storage space.

2. The method of claim 1, wherein the at least one block storage device comprises flash memory.

3. The method of claim 1, wherein a double data rate (DDR) interface is utilized to interface the at least one DRAM module and the at least one block storage device, the DDR interface comprising a double data rate type 2 (DDR2) interface, a double data rate type 3 (DDR3) interface, or a double data rate type 4 (DDR4) interface.

4. The method of claim 1, wherein the computer includes a hardware abstraction layer between the at least one block storage device and the computer, the hardware abstraction layer allowing the computer to use the at least one DRAM module and the at least one block storage device as DRAM space or block storage space.

5. The method of claim 1, wherein said transforming the at least one block storage device back to block storage space, comprises:
   the computer mapping the at least one block storage device so that the at least one block storage device is used for block storage; and
   the computer resuming inputs and outputs (I/O's) and caching processes corresponding to the at least one block storage device.

6. The method of claim 1, wherein said configuring at least one DRAM module and at least one block storage device for utilization as DRAM space or block storage occurs during a boot up phase of the computer.

7. A computer program product for utilizing a block storage device as Dynamic Random-Access Memory (DRAM) space, the computer program product comprising:
   computer-readable storage media that is not a transitory signal, and program instructions stored on the computer-readable storage media, the program instructions executable by a processor to:
   configure at least one DRAM module and at least one block storage device for utilization as DRAM space or block storage;
   determine that more DRAM space is required;
   responsive to determining that more DRAM space is required, transform at least one block storage device to DRAM space including pausing inputs and outputs (I/O's) and caching processes corresponding to the at least one block storage device and also including mapping the at least one block storage device so that the at least one block storage device can be used as DRAM space;
   determine that the at least one block storage device is no longer required to be used as DRAM space; and
   responsive to determining that the at least one block storage device is no longer required to be used as DRAM space, transform the at least one block storage device back to block storage space.

8. The computer program product of claim 7, wherein the at least one block storage device comprises flash memory.

9. The computer program product of claim 7, wherein a double data rate (DDR) interface is utilized to interface the at least one DRAM module and the at least one block storage device, wherein the DDR interface is selected from the group consisting of a double data rate type 2 (DDR2)

interface, a double data rate type 3 (DDR3) interface, and a double data rate type 4 (DDR4) interface.

10. The computer program product of claim 7, wherein the computer includes a hardware abstraction layer between the at least one block storage device and the computer, the hardware abstraction layer allowing the computer to use the at least one DRAM module and the at least one block storage device as DRAM space or block storage space.

11. The computer program product of claim 7, wherein the program instructions executable by a processor to transform the at least one block storage device back to block storage space, comprise program instructions executable by a processor to:
    map the at least one block storage device so that the at least one block storage device is used for block storage; and
    resume inputs and outputs (I/O's) and caching processes corresponding to the at least one block storage device.

12. The computer program product of claim 7, wherein the program instructions executable by a processor to configure at least one DRAM module and at least one block storage device for utilization as DRAM space or block storage are executed during a boot up phase of the computer.

13. A computer system for utilizing a block storage device as Dynamic Random-Access Memory (DRAM) space, the computer system comprising:
    one or more computer processors;
    one or more computer-readable storage media;
    program instructions stored on the computer-readable storage media for execution by at least one of the one or more processors to:
    configure at least one DRAM module and at least one block storage device for utilization as DRAM space or block storage;
    determine that more DRAM space is required;
    responsive to determining that more DRAM space is required, transform at least one block storage device to DRAM space including pausing inputs and outputs (I/O's) and caching processes corresponding to the at least one block storage device and also including mapping the at least one block storage device so that the at least one block storage device can be used as DRAM space;
    determine that the at least one block storage device is no longer required to be used as DRAM space; and
    responsive to determining that the at least one block storage device is no longer required to be used as DRAM space, transform the at least one block storage device back to block storage space.

14. The computer system of claim 13, wherein a double data rate (DDR) interface is utilized to interface the at least one DRAM module and the at least one block storage device, wherein the DDR interface is selected from the group consisting of a double data rate type 2 (DDR2) interface, a double data rate type 3 (DDR3) interface, and a double data rate type 4 (DDR4) interface.

15. The computer system of claim 13, wherein the computer includes a hardware abstraction layer between the at least one block storage device and the computer, the hardware abstraction layer allowing the computer to use the at least one DRAM module and the at least one block storage device as DRAM space or block storage space.

16. The computer system of claim 13, wherein the at least one processor for execution of the program instructions to transform the at least one block storage device back to block storage space, comprises the at least one processor for further execution of the program instructions to:
    map the at least one block storage device so that the at least one block storage device is used for block storage; and
    resume inputs and outputs (I/O's) and caching processes corresponding to the at least one block storage device.

17. The computer system of claim 13, wherein the at least one processor configures the at least one DRAM module and the at least one block storage device for utilization as DRAM space or block storage occurs during a boot up phase of the computer.

* * * * *